United States Patent [19]
Boudry

[11] Patent Number: 5,952,891
[45] Date of Patent: *Sep. 14, 1999

[54] VARIABLE DELAY CELL WITH HYSTERESIS AND RING OSCILLATOR USING SAME

[75] Inventor: Jean-Marie Boudry, Beynes, France

[73] Assignee: Bull S.A., Louveinnes, France

[ * ] Notice: This patent issued on a continued prosecution application filed under 37 CFR 1.53(d), and is subject to the twenty year patent term provisions of 35 U.S.C. 154(a)(2).

[21] Appl. No.: 08/874,411

[22] Filed: Jun. 13, 1997

[30] Foreign Application Priority Data

Jun. 19, 1996 [FR] France .................................. 96 07604

[51] Int. Cl.$^6$ ....................................................... H03B 5/02
[52] U.S. Cl. .............................. 331/57; 327/264; 327/281
[58] Field of Search .............................. 331/57; 327/264, 327/272, 281, 288

[56] References Cited

U.S. PATENT DOCUMENTS

| | | | |
|---|---|---|---|
| 5,208,557 | 5/1993 | Kersh, III | 331/57 |
| 5,250,914 | 10/1993 | Kondo | 331/111 |
| 5,459,437 | 10/1995 | Campbell | 331/111 |
| 5,621,360 | 4/1997 | Huang | 331/57 |

FOREIGN PATENT DOCUMENTS 601780  6/1994  European Pat. Off. .

OTHER PUBLICATIONS

Sarbacher, Encyclopedic Dictionary of Electronics and Nuclear Engineering, p. 608, Prentice–Hall, Inc. 1959.

IEEE Journal of Solid State Circuits, vol. 22, No. 2, Apr. 1, 1987, New York, U.S., pp. 255–261, XP002027247 D. Jeong: "Design of PLL Based Clock Generation Circuits".

*Primary Examiner*—Siegfried H. Grimm
*Attorney, Agent, or Firm*—Kerkam, Stowell, Kondracki & Clarke, P.C; Edward J. Kondracki

[57] ABSTRACT

A variable frequency ring oscillator is controlled by a control signal and has an odd number of cascaded inverting gates. The inverting gates each have input terminals receiving an input signal. Except for the first of the cascaded inverting gates, each input signal on a gate is the output from the preceding inverting gate. The input terminal of the first of the inverting gates receives the output of the last of the inverting gates. At least one inverting gate is a cell having a gain variable as a function of a control signal. An output signal ext of the circuit is an inversion of an input signal inp and has a hysteresis that is a function of a control signal cont. The term "hysteresis" as used herein signifies, for example, a variable frequency signal remaining substantially in its current state for a certain length of time after which the variable frequency signal changes state with a magnitude that is a function of a control signal, upon change of state of an input signal.

16 Claims, 11 Drawing Sheets

FIG_3
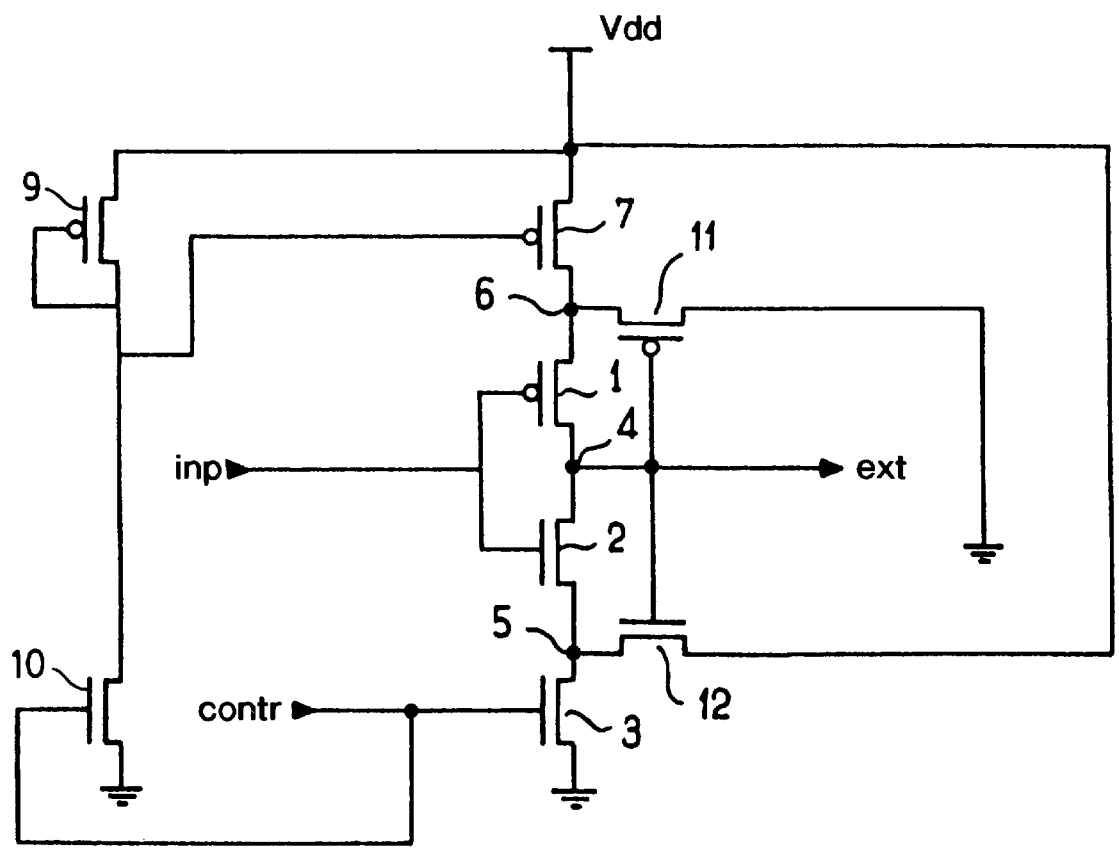

FIG_7

VARIABLE DELAY CELL WITH HYSTERESIS AND RING OSCILLATOR USING SAME

BACKGROUND OF THE INVENTION

1. Field of the Invention

The invention relates to a ring oscillator that performs a process for obtaining a variable frequency signal and variable frequency oscillators embodied by means of a loop comprising an odd number of inverting cells connected in series, some of which are variable delay cells. The control of the delay acts directly on the value of the frequency. Cells of this type can be used in other applications such as signal synchronization.

2. Description of Related Art

According to the prior art, a control signal can be used to cause the variation of a leading edge of an input signal to a cell for changing the state of the output signal of the cell at the change of state of the input signal. A steep leading edge makes it possible to obtain a short delay. A leading edge with a gradual slope makes it possible to obtain a longer delay. An oscillating signal is obtained whose semi-oscillation is equal to the sum of the delays of each cell. When it comes to obtaining high frequencies, for example higher than 1 GHz, cells of this type present a drawback, because it is difficult to reduce the number of cells in a loop, while maintaining a frequency variation range which is sufficient to eliminate the problems of manufacturing tolerances and deviations in voltage and temperature. In effect, a minimal number of inverting cells is required to guarantee that the output signal of a cell reaches an extreme low or high level before its input signal is inverted. The minimum period obtained with the addition of the intrinsic delays of each cell therefore limits the maximum frequency that can be obtained.

SUMMARY OF THE INVENTION

The object of the invention is to provide a ring oscillator which produces an associated high-frequency oscillation which is variable within an appreciable range.

In order to obtain a variable frequency signal of this type, the invention offers a process which loops an inverted signal to an input of an oscillator with a delay controlled by a control signal, characterized in that an inversion of the inverted signal has a hysteresis with a magnitude that is a function of the control signal.

The invention is also embodied in a variable delay cell wherein the transition time between two states is minimal, whatever the delay controlled within an appreciable range, for example spanning from 1 to 16.

The invention offers a cell for obtaining a signal extracted with a variable delay from an input signal. An inverting amplifier having gain controlled by a control signal is used. Hysteresis is provided. The gain of the amplifier is controlled by feeding back the extracted signal, i.e., the output signal, so as to act on the gain of the amplifier thereby controlling the amplification of the input signal (inp).

BRIEF DESCRIPTION OF THE DRAWINGS

Various refinements of the invention will emerge from the following description in reference to the figures.

FIG. 3 represents a first example of a delay cell according to the invention.

DETAILED DESCRIPTION OF THE INVENTION

Figure 1:
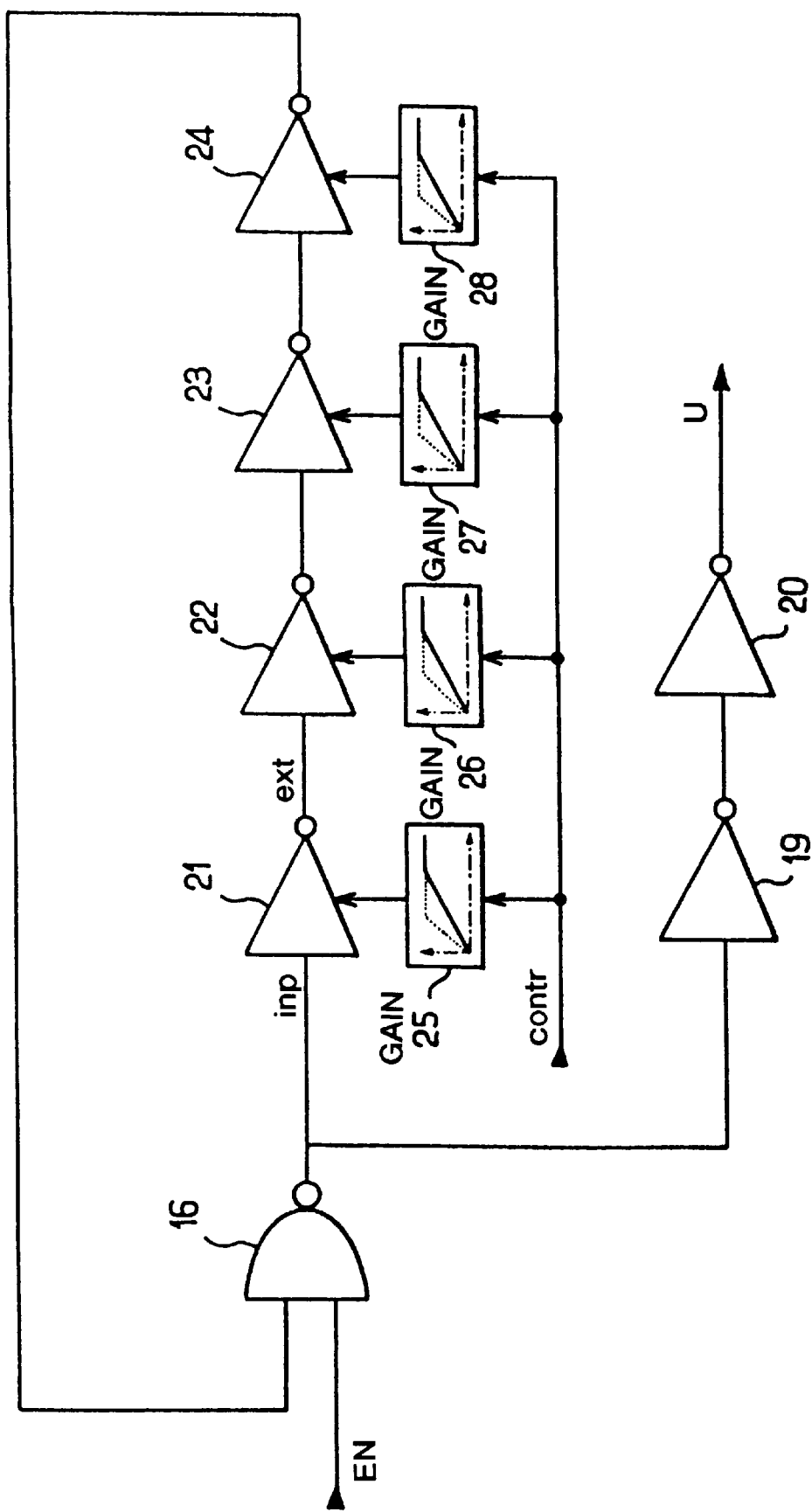
FIG. 1 represents an oscillator of the prior art.

FIG. 1 represents an oscillator of the prior art. This oscillator comprises an odd number of inverting gates 16, 21, 22, 23, 24 such that an input of each gate is fed by an output of the preceding gate, the input of the first gate 16 being fed by the output of the last gate 24. Each gate 21, 22, 23, 24 supplies an extracted or output signal ext which is inverted relative to an input signal inp. Each gate 21, 22, 23, 24 has a variable gain 25, 26, 27, 28 controlled by a control signal contr. The gain is represented by the temporal evolution of the extracted or output signal ext following a descent on a steep leading edge of the input signal inp. It is possible to distinguish a first part with a positive gradient which symbolizes the rise time of the output signal ext, and a second part with a null gradient which symbolizes the attainment of a stable state of the output signal ext. The control signal contr makes it possible to vary the slope of the first part. A weak control signal contr makes it possible to obtain a gradual slope and a strong control signal contr makes it possible to obtain a steep slope. The more gradual the slope, the longer the delay τ of the output signal ext on the input signal inp. It is therefore possible to vary the delay of each inverting gate 21, 22, 23, 24 by varying the control signal contr. According to the example in FIG. 1, with four identical gates, the input signal inp entering the gate 21 re-enters the gate 16 with a delay controlled by the control signal contr equal to 4τ. The gate 16 is a NAND gate, one input of which is fed by a signal EN for starting the oscillator. If the intrinsic delay of the gate 16 is τ', setting the signal EN to 1 makes it possible to invert the input signal inp introduced into the gate 21 with a delay T=4τ+τ'. This creates an instability which causes the input signal inp to oscillate with a frequency equal to ½T. By increasing the number of inverting gates, greater values of T, and hence lower frequencies, are obtained. For a fixed number of inverting gates, it is possible to obtain lower frequencies with lower values of the control signal contr and higher frequencies with higher values of the control signal contr.

The input signal inp introduced into the gate 21 is also introduced into a succession of two inverters 19, 20 so that it can externally output a signal U oscillating at the desired frequency.

The oscillator in FIG. 1 is limited in terms of frequencies by the number of gates cascaded and the minimum delay of each gate. In order to increase the frequency of such an oscillator, it is possible to try to reduce the number of inverter gates to the minimum, that is, to three, or even to one variable delay gate 21. With a maximum control signal contr, it would be possible to obtain a maximum frequency. Simulations in a circuit similar to that in FIG. 1 with two gates 21, 22 looped back to an input of the gate 16 showed that the frequency variation range is limited. It is difficult to reduce the frequency in order to adjust it. When the value of the control signal contr was reduced to a third of its maximum value, the simulations revealed that the frequency did not vary much. When the value of the control signal contr was further reduced, the circuit stopped oscillating. This phenomenon is explained by the fact that a substantial delay in the gate 21 does not allow the signal enough time to reach an extreme high or low value before the input signal inp is inverted. When the closed-loop gain of the circuit becomes less than 1, it simply stops oscillating.

Figure 2A:
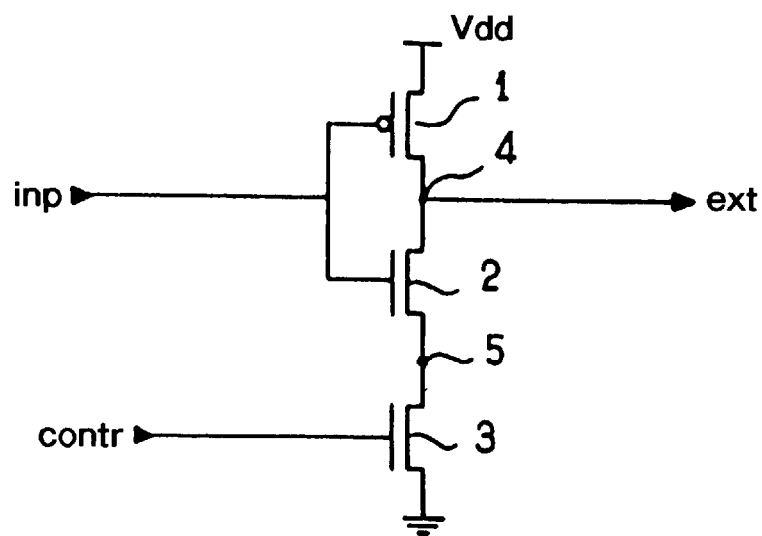
FIGS. 2a and 2b represent delay cells which can be used to embody an oscillator like that in FIG. 1.

FIG. 2a shows an example of an inverting cell with MOS transistors wherein the extracted output signal ext has a delay τ relative to the input signal inp introduced. A PMOS transistor 1 has a source connected to a potential Vdd, a gate set to the potential of the input signal inp and a drain connected to a node 4 whose potential determines the value of the extracted signal ext. An NMOS transistor 2 has a drain connected to the node 4, a gate set to the potential of the signal inp and a source connected to a node 5. An NMOS transistor 3 has a drain connected to the node 5, a source connected to a ground potential and a gate set to the potential of a control signal contr with a given positive value.

The transistors 1 and 2 are sized so as to have identical current-voltage characteristics. A value of the input signal inp close to the ground potential turns the transistor 1 on and the transistor 2 off. In the stable state, the node 4 is charged to a potential value equal to Vdd.

A value of the input signal inp close to the potential Vdd turns the transistor 1 off and the transistor 2 on. The value of the control signal contr is sufficiently positive for the transistor 3 to be on. In the stable state, the node 4 is discharged to a potential value equal to the ground potential.

When the input signal inp changes from a high value close to the potential Vdd to a low value close to the ground potential, the gate-source voltage of the transistor 1 becomes equal to its drain-source voltage, while the gate-source voltage of the transistor 2 turns off, thus turning off the transistor 2. A current is established between the drain and the source of the transistor 1 so as to charge the node 4 to a high potential value Vdd with a leading edge having a maximum rise f1 which is a function of the current-voltage characteristics of the transistor 1, essentially in the unsaturated state. For a low value of the input signal inp, the output signal ext reaches a high value. Thus, it is noted that the transistors 1 and 2 behave like an inverting amplifier whose transfer function of the first order is comparable in the first sequence to a minimal time constant filter τ1.

When the input signal inp changes from a value close to the ground potential to a value close to the potential Vdd, the grid-source voltage Vgs of the transistor 1 turns off, thus turning off the transistor 1, while the gate-source voltage Vgs of the transistor 2 becomes equal to its drain-source voltage Vds, placing the transistor 2 in an on state which is essentially unsaturated. Although the drain-source voltage Vds of the transistor 3 is substantially higher than the potential value of the control signal contr, the transistor 3 is in the saturated state and applies a current between the drain and the source of the transistor 2 as a function of its current-voltage characteristic for a given gate-source voltage, that is, a function of the value of the control signal contr. This has the effect of discharging the node 4 to a low potential value following a voltage ramp until the transistor 3 is desaturated. The node 4 then continues to discharge in order to reach the ground potential value with a residual time constant τ2. For a high value of the input signal inp, the output signal ext reaches a low value. The transistors 1, 2 and 3 behave like an inverting amplifier whose transfer function is comparable at the start of switching to a ramp. For values of the control signal contr close to Vdd, the transistor 3 does not function practically in the saturated state and the transfer function is of the first order comparable to a minimal time constant filter with a magnitude of τ1. The lower the value of the control signal contr, the lower the saturation current of the transistor 3, and thus the longer the ramped part and the more gradual the slope. The output signal ext has, on descent, a delay τ relative to the rise of the input signal inp. The delay τ is even more substantial the more gradual the slope of the ramp, that is, the weaker the control signal contr. Thus it is noted that it is possible to act on the delay of the cell in FIG. 2a by acting on the value of the control signal contr.

By connecting the source of the transistor 2 directly to the ground and replacing the transistor 3 with a PMOS transistor having identical current-voltage characteristics between the source of the transistor 1 and the potential Vdd, for the sake of operational symmetry, a delay τ of the output signal ext at its rise would be observed relative to the descent of the input signal inp. It would then be possible to obtain a delay τ that varies according to the value of the control signal contr that is the delay is shorter the closer the value of the control signal contr on the gate of this PMOS transistor is to the ground potential, or longer, the closer the value of the control signal contr on the gate of this PMOS transistor is to the potential Vdd.

The two circuits proposed in the model in FIG. 2a have the characteristic of having leading edges which are asymmetrical on the rise and on the descent.

Figure 2B:
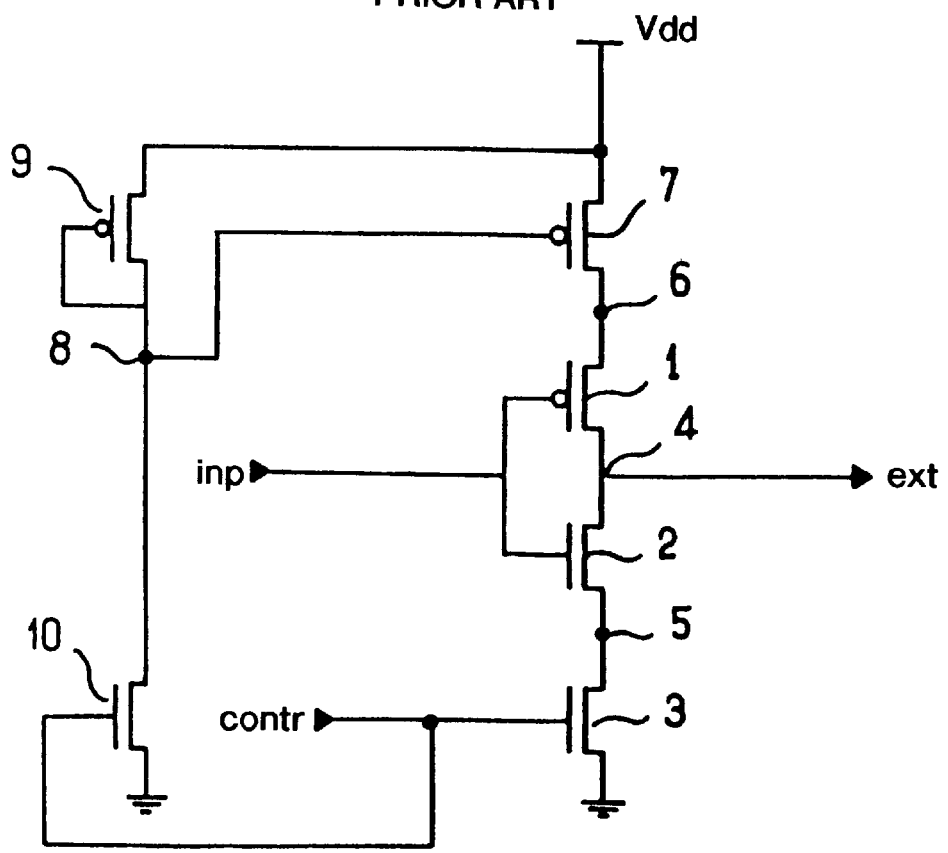

FIG. 2b shows an example of a cell which makes it possible to obtain symmetrical leading edges on the rise and on the descent of the output signal ext. In this cell, however, the transistors 1, 2 and 3 of the cell in FIG. 2a, arranged in identical fashion, are different in that the source of the transistor 1 is no longer directly connected to the potential Vdd but to an intermediate node 6. A PMOS transistor 7 has a source connected to the potential Vdd, a drain connected to the node 6 and a gate connected to a node 8. A PMOS transistor 9 has a source connected to the potential Vdd, a drain connected to the node 8 and gate set to the potential of the drain of the transistor 9. An NMOS transistor 10 has a drain connected to the node 8, a source connected to the ground potential and a gate set to the same potential as the gate of the transistor 3. The transistor 9 is sized so as to have the same current-voltage characteristics as the transistor 7, and the transistor 10 is sized so as to have the same current-voltage characteristics as the transistor 3.

Since the gate-source voltages of the transistors 7 and 9, applied by the node 8, are identical, the drain-source current of the transistor 7 in the on state is the image of the drain-source current of the transistor 9. The potential of the node 8 is naturally established at an operating point such that the drain-source current of the transistor 9 is equal to the drain-source current of the transistor 10. By sizing the transistors 9 and 10 so that they have similar current-voltage characteristics, a current behavior is obtained which is a function of the control signal contr and the drain-source voltage, which is identical for the transistors 3 and 7. Thus the same ramped part, and therefore the same delay τ, is observed on the rise as on the descent of the output signal ext, relative to the descent or the rise of the input signal inp.

FIG. 3 shows an example of a cell similar to that in FIG. 2b, with the following additional characteristics. A PMOS transistor 11 has a source connected to the node 6, a drain connected to the ground potential and a gate set to the potential of the node 4. An NMOS transistor 12 has a source connected to the node 5, a drain connected to the potential Vdd and a gate set to the potential of the node 4.

The cell in FIG. 3 operates in the following way. A stable high state, at the potential Vdd, of the output signal ext corresponds to a stable low state, at the ground potential, of the input signal inp. In this state, the transistor 1 is on and the transistor 2 is off. The potential of the node 4, at the value Vdd, turns the transistor 11 off, thus setting the potential of the node 6 at the value Vdd. The potential of the node 4, at the value Vdd, turns the transistor 12 on, thus setting the potential of the node 5 at an intermediate value Vi between the potential Vdd and the ground potential as a function of the current-voltage characteristics of the transistors 3 and 12.

Figure 6:
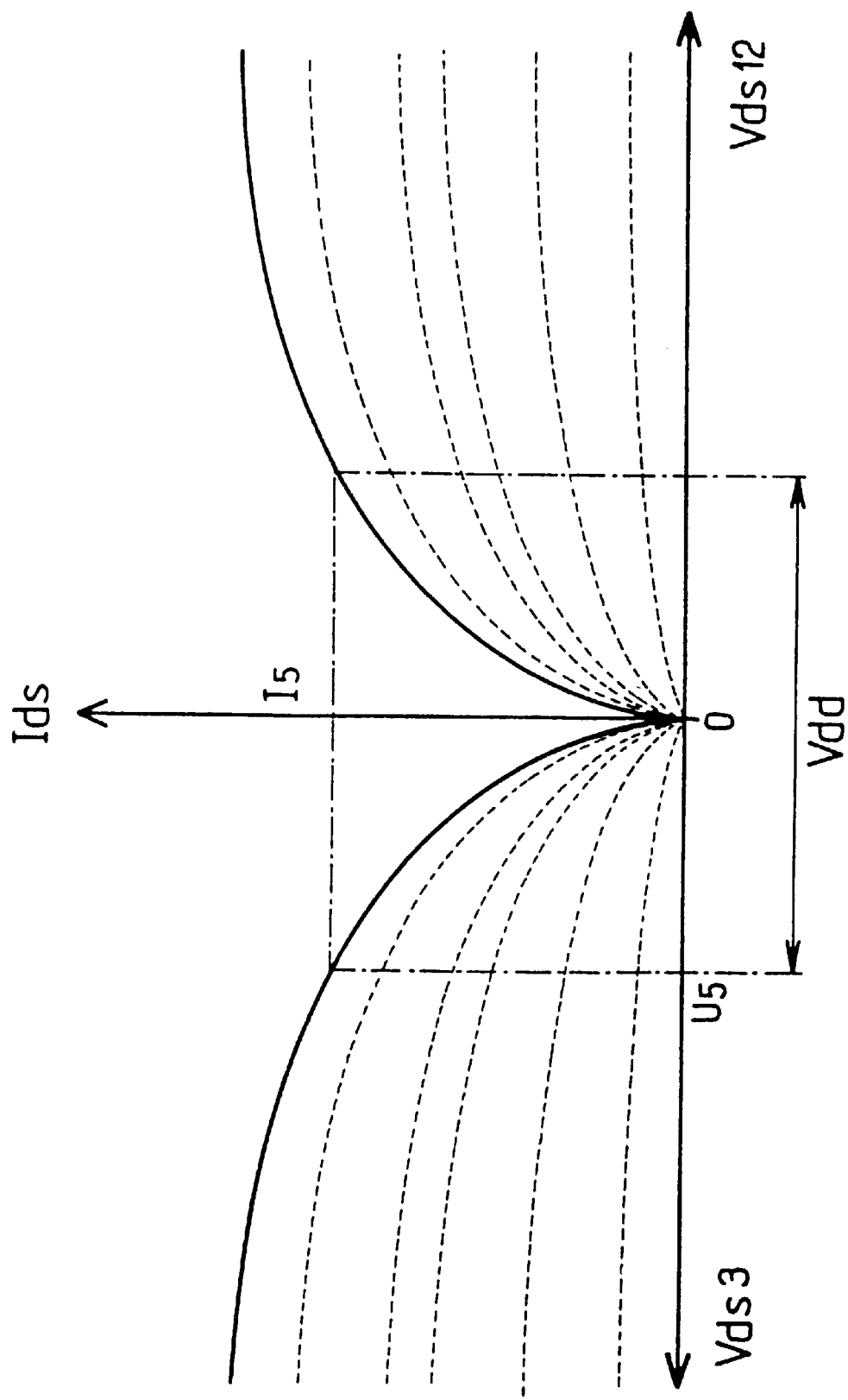
FIGS. 6 through 9 represent current-voltage characteristics of MOS transistors for various gate voltage values for the first example of a delay cell.
Figure 7:
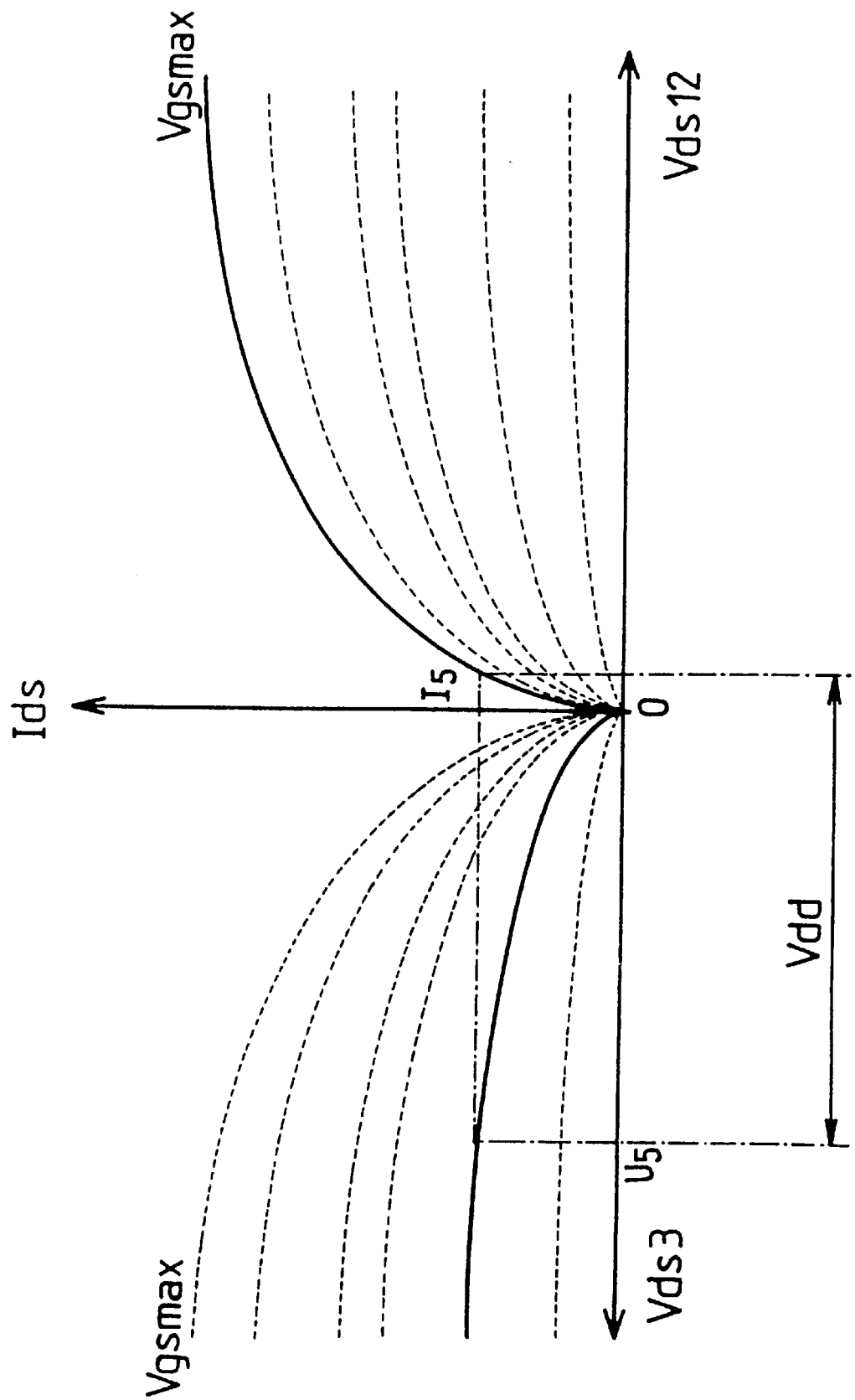

The operation of the transistors 3 and 12 will be better understood with the aid of FIGS. 6 and 7, which schematically represent the current-voltage characteristics for the transistor 3 on the left and for the transistor 12 on the right. In the stable high state of the output signal ext, the transistor 2 is off. The drain-source current Ids, shown on the ordinate, is identical for the transistors 3 and 12. The abscissa oriented to the left represents the drain-source voltage Vds3 of the transistor 3 and the abscissa oriented to the right represents the drain-source voltage Vds 12 of the transistor 12. In each upper quadrant delimited by the axes of the ordinate and the abscissa, various curves are plotted in solid and dotted lines, each of which is a characteristic curve of the current Ids as a function of the voltage Vds of the transistor in question, for a given gate-source voltage value Vgs. All these curves substantially converge toward 0 and have a part asymptotic to Ids which is nearly constant for the large values of Vds, which are greater the higher the voltage Vgs. The asymptotic part corresponds to the saturated state of the transistor in question. The voltage between the drain of the transistor 3 and the source of the transistor 12 is constant and is symbolized by a linear segment Vdd. The curves in solid lines are those which correspond to the voltages Vgs in the stable high state of the output signal ext. The intersections with the axes Ids and Vds3 of a rectangle shown in broken lines having a width Vdd, indicate the current I5 and voltage U5 operating points in the node 5.

FIG. 6 gives an example in which the control signal contr is close to Vdd. The gate of the transistor 12 being at the potential Vdd, the voltages Vgs are greater than or equal to the voltages Vds for the two transistors 3 and 12. The transistors 3 and 12 therefore operate in the unsaturated state. FIG. 6 represents an operating point (I5, U5) for transistors 3 and 12 with identical characteristic curves. However, the following explanation remains valid for transistors 3 and 12 with different characteristic curves by shifting the rectangle in broken lines slightly to the left or to the right.

Figure 8:
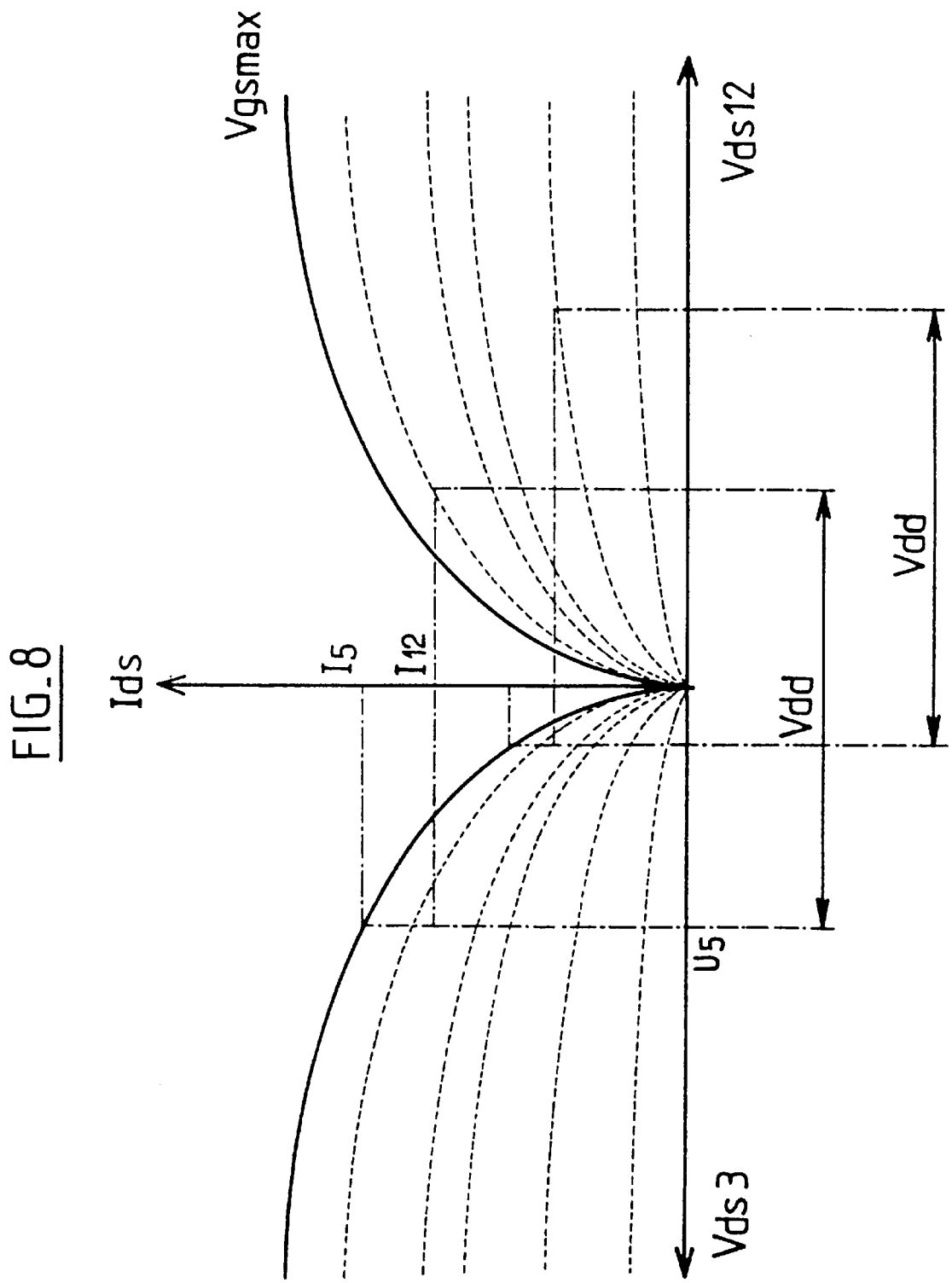

A steep leading edge of the change of the input signal inp to the potential Vdd, which is higher than the potential of the node 5, causes a rapid turn-on of the transistor 2 in the unsaturated state and the turn-off of the transistor 1. In this case, the high value of the control signal contr causes the transistor 3 to remain on its characteristic curve at Vgsmax. Two operating states of the transistor 12 can be seen in FIG. 8. FIG. 8 represents the superimposition of two operating instants, an instant in a first state R1 symbolized by the segment Vdd shifted to the left and an instant in a second state R2 symbolized by the segment Vdd shifted to the right.

In the first state R1, the turn-on of the transistor 2 has the effect of causing the flow of a current $I_2$ which is added to the current $I_{12}$ of the transistor 12 so as to obtain the current $I_5$. This has two effects. A first effect increases the voltage Vds3 of the transistor 3 in order to absorb the additional current $I_2$. The operating points have a tendency to move toward the left of the figure. The second effect reduces the voltage of the node 4 and changes the transistor $I_2$ to the characteristic curve of the state R1 by reducing its voltage Vgs. However, as seen in the figure, the current $I_2$ equal to $I_5-I_{12}$ remains weak and the node 4 discharges slowly, remaining at a potential level close to Vdd. The operating points of the transistor 12 remain on characteristic curves close to that of Vgsmax by slightly reducing the current $I_{12}$. The transistor 12 therefore causes an inverse feedback which acts in opposition to the potential reduction of the node 4. The result of this is to keep the extracted or output signal ext close to the high value.

In the second state R2, the change of the transistor 12 to lower characteristic curves of Vgs is accelerated. The tendency to move the operating points to the left reverses. The placing into saturation of the transistor 12 causes an avalanche effect which abruptly moves the operating points to the right, rapidly changing the voltage Vdd to the voltage Vds12 until the transistor 12 turns off. FIG. 8 shows that the operating points of the transistor 3 are on the part with the high gradient of the characteristic curve. The effect of this is to bring the output signal ext to its low value following a steep leading edge.

The operating states presented in FIGS. 6 and 8 are those which cause the shortest delays, since the currents $I_3$ are the strongest that can be obtained, due to the high value of control signal contr.

FIG. 7 gives an example in which the control signal contr is close to the ground potential. The gate-source voltage of the transistor 3 is low. The transistor 3 is operating in the saturated state and globally behaving like a current source. In the stable high state of the signal ext, the gate of the transistor 12 is at the potential Vdd. Its voltage Vgs being similar in magnitude to its voltage Vds, the transistor 12 is operating in the unsaturated state. FIG. 7 shows operating points on the left with a weak current $I_5$. A substantial part of the voltage Vdd is absorbed by the transistor 3. The drain-source voltage of the transistor 12 is low and the potential of the node 5 is close to Vdd.

Figure 9:
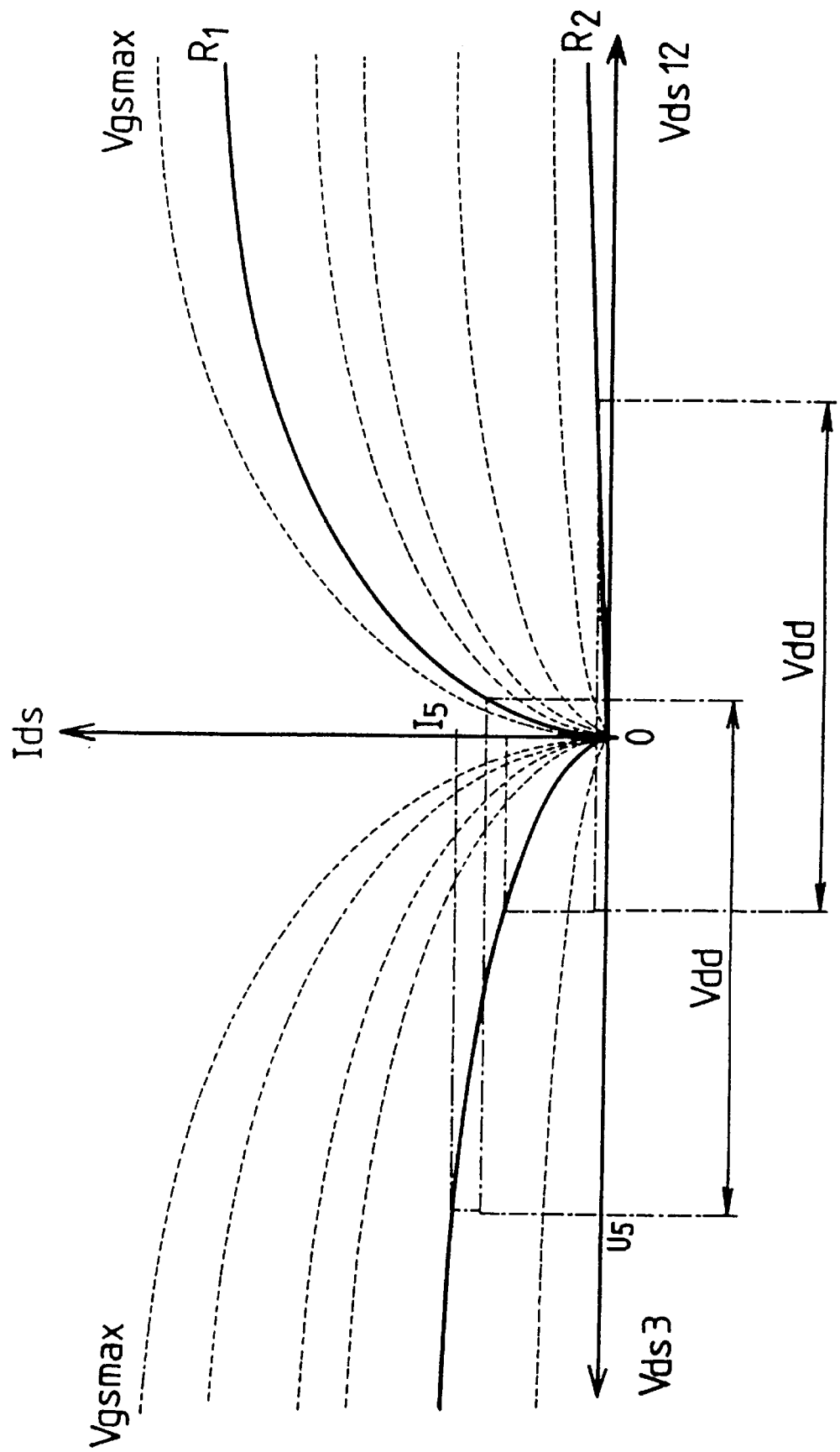

A steep leading edge of the change of the input signal inp to the potential Vdd, which is higher than the potential of the node 5, causes a rapid turn-on of the transistor 2 in the unsaturated state and the turn-off of the transistor 1. In this case, the low value of the control signal contr causes the transistor 3 to remain at a practically constant current. Two operating states of the transistor 12 can be seen in FIG. 9. FIG. 9 represents the superimposition of two operating instants, an instant in a first state R1 symbolized by the segment Vdd shifted to the left and an instant in a second state R2 symbolized by the segment Vdd shifted to the right.

In the first state R1, the turn-on of the transistor 2 has the effect of causing the flow of a current $I_2$ which is added to the current $I_{12}$ of the transistor 12 so as to obtain the current $I_5$. This has two effects. A first effect increases the voltage Vds3 of the transistor 3 in order to absorb the additional current $I_2$. The operating points have a tendency to be shifted to the left of the figure. The second effect reduces the voltage of the node 4 and changes the transistor 12 to the characteristic curve of the state R1 by reducing its voltage Vgs. However, as seen in the figure, the current $I_2$ equal to $I_5-I_{12}$ remains weak and the node 4 discharges slowly, remaining at a potential level close to Vdd. The operating points of the transistor 2 remain on characteristic curves close to that of Vgsmax by slightly reducing the current $I_{12}$. The transistor 12 then causes an inverse feedback which acts in opposition to the lowering of the potential of the node 4. This has the result of keeping the output signal ext close to the high value. The output signal ext is kept at its high value longer than in the example in FIGS. 6 and 8 because the current in the transistor 2 is very weak due to the current source behavior of the transistor 3.

In the second state R2, the change of the transistor 12 to lower characteristic curves of Vgs accelerates more easily the nearer the latter are to the vicinity of the point 0 and the more preponderant the current $I_2$ of the transistor 2 becomes relative to the current $I_{12}$ of the transistor 12. The tendency to shift the operating points to the left is reversed. The placement into saturation of the transistor 12 causes an avalanche effect which abruptly shifts the operating points to the right, rapidly changing the voltage Vdd to the voltage Vds12 until the transistor 12 turns off. FIG. 9 shows that the operating points of the transistor 3 are close to the high-gradient part of the characteristic curve. This has the effect of bringing the output signal ext to its low value following a steep leading edge.

The operating states presented in FIGS. 7 and 9 are those which produce long delays, since the weak currents $I_3$ result in weak currents $I_2$, which cause a hysteresis at the change of state of the output signal ext. At the end of hysteresis, the change of state occurs with a steep leading edge having a slope comparable to that which can be observed in the example explained in FIGS. 6 and 8.

For the sake of symmetry, the behavior of the transistors 1, 7 and 11 for the change of the output signal ext from the low state to the high state is identical to the behavior of the transistors 2, 3 and 12 for the change of the output signal ext from the high state to the low state. The explanations below remain valid when dealing with the characteristic curves for PMOS transistors, replacing the node 5 with the node 6 and the voltages Vds3, Vds12 with Vds7, Vds11.

In the preceding, FIGS. 6 through 9 do not attempt to determine the operating points with the precision afforded by the complete equations of the transistors. Their schematic form makes it possible to explain the significance of the transistor 12 or the transistor 11 in a simple way.

FIG. 3 presents an improvement according to the invention of an example of the cell shown in FIG. 2b. The use of the sole transistor 12 also makes it possible to improve an example of the cell shown in FIG. 2a.

In a simplified way, the teaching of the preceding is the following. The change of the input signal inp from the low state to the high state turns off the transistor 1 and turns on the transistor 2, which then discharges the node 4 to bring it to the potential of the node 5. The transistor 12 causes a reaction which acts in opposition to the lowering of the potential of the node 4 directly to the ground potential through the transistor 3. In a first phase, the potential of the node 5 remains close to the value Vi, while the potential of the node 4 remains high enough to keep the transistor 12 on. However, the lowering of the potential of the node 4 reduces the conductivity of the transistor 12, which contributes to the lowering of the potential of the node 5. In a second phase, the potential of the node 4 is no longer high enough to maintain the consequent conductivity of the transistor 12, and the lowering of the potential of the node 4 toward the ground potential accelerates, causing the turn-off of the transistor 12.

The reaction of the transistor 12 causes a break in the descending leading edge of the output signal ext like that observed with the cell in FIG. 2b. In the first phase, the descending leading edge is gradual and resembles a hysteresis, due to the reaction of the transistor 12 which has a tendency to maintain the high potential of the node 4. In the second phase, the descending leading edge is steep, due to the disappearance of the reaction of the transistor 12 and to the current already established in the transistor 3.

For the sake of symmetry in FIG. 3, in a way that is similar to the process described above, the transistors 1, 7 and 11 cause the output signal ext to change from the value of the ground potential to the value of the potential Vdd when the input signal inp changes from the value of the potential Vdd to the value of the ground potential.

With the cell in FIG. 3, in order to obtain a short delay in the change of state of the output signal ext at the change of state of the input signal inp, the control signal contr orders a low value for the resistance of the transistors 3 and 7. The reaction provided by the transistors 11 and 12 is therefore weak due to their resistance value which is preponderant over that of the transistors 3 and 7. The output signal ext varies rapidly between the extreme potential values of the initial state and the final state. The delay of the output signal (ext) is of a magnitude that is a function of the control signal (contr), wherein after a change in a value of the input signal corresponding to a first logic state of the input signal (inp), the output signal (ext) tends to maintain a voltage value corresponding to its preceding value for a certain length of time after which the value of the output voltage signal physically changes to a second value corresponding to the second logic state.

In order to increase the delay in the change of state of the output signal ext at the change of state of the input signal inp, the control signal contr increases the value of the resistance of the transistors 3 and 7. The reaction provided by the transistors 11 and 12 therefore increases due to their fixed resistance value whose ratio to that of the transistors 3 and 7 decreases. The output signal ext remains close to the extreme value of the initial state for a longer time before varying rapidly toward the extreme potential value of the final state. The output signal ext is thus at intermediate potential values between the extreme potential values for less time. The leading edge of the change of state remains steep, even for obtaining substantial delays.

Figure 4:
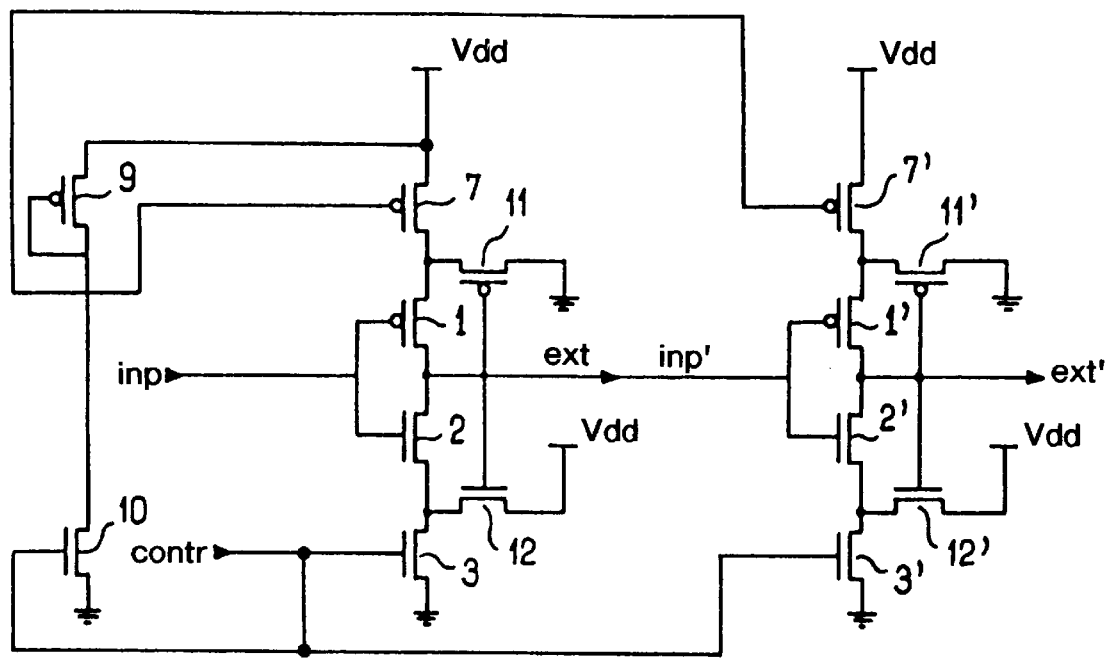
FIG. 4 represents a possible cascading of cells according to the invention.

FIG. 4 shows an example of two cells according to the model in FIG. 3, connected in series. The output of a cell and its output signal ext constituted by transistors 1, 2, 3, 7, 11, 12 is connected to the input of a cell constituted by transistors 1', 2', 3', 7', 11', 12' to receive input signal inp'. The output signal ext' therefore makes it possible to obtain a delay which is double that obtained with a single cell. Likewise the connection of the input inp' of a third cell to the output ext' of the second cell makes it possible to obtain a delay which is triple that obtained with a single cell. Thus, it is possible to multiply the delay by the number of cells placed end to end. A single current mirror stage constituted by transistors 9, 10 is enough to control the variable resistances of all the cells.

Figure 10:
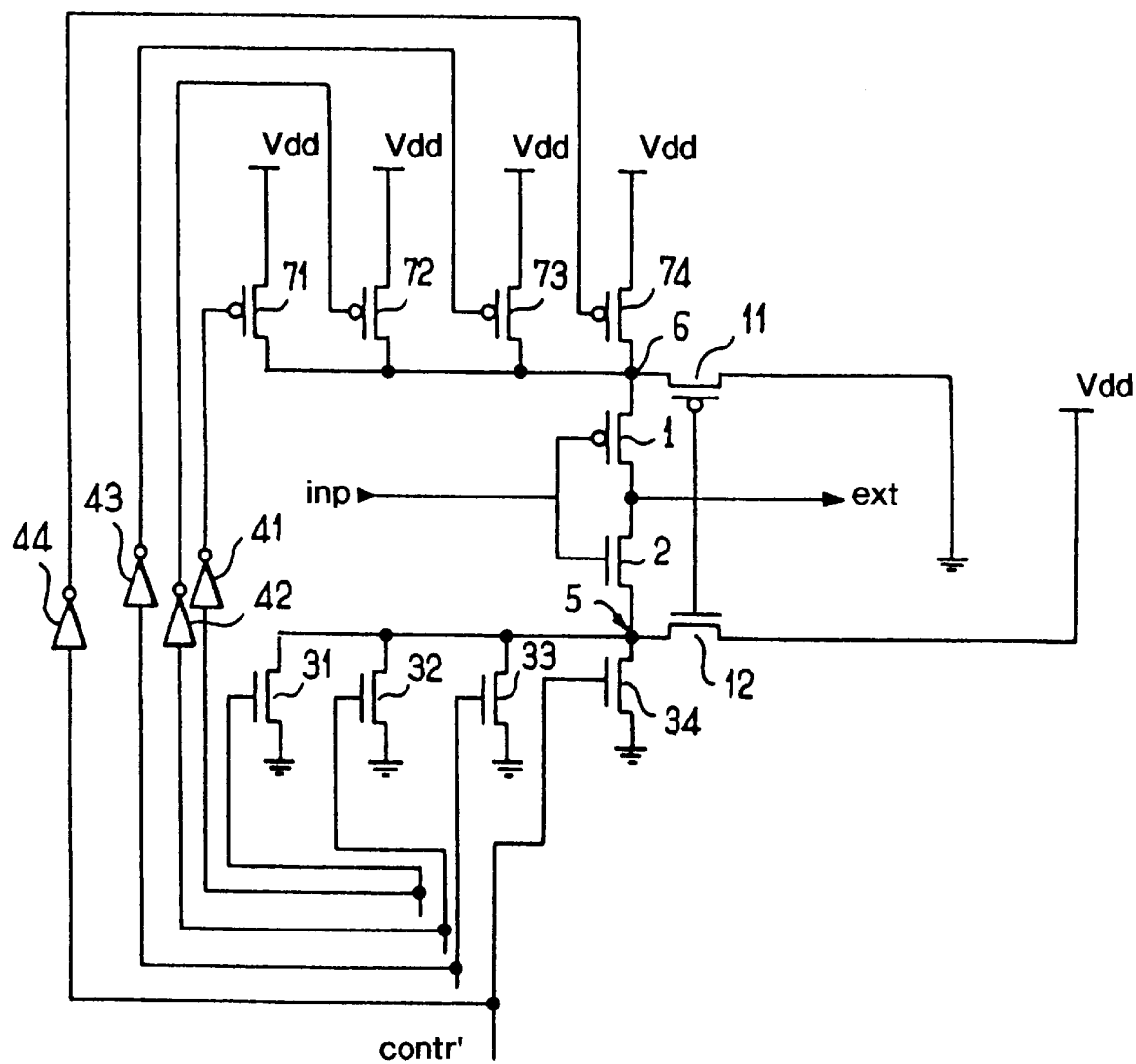
FIG. 10 represents a second example of a delay cell according to the invention.

FIG. 10 shows an example of a cell which operates in a way similar to the one in FIG. 3, except that the transistor 3 is replaced by a plurality of transistors 31, 32, 33, 34 connected in parallel between the node 5 and the ground, and that the transistor 7 is replaced by a plurality of transistors 71, 72, 73, 74 connected in parallel between the node 6 and the potential Vdd. The analog control signal contr in FIG. 3 is replaced by a digital control signal contr' coded in a number of bits equal to the number of transistors 31, 32, 33, 34. Each bit transmits a binary signal, equal to the potential Vdd or to the ground potential, to the gate of a transistor 31, 32, 33, 34. Inverters 41, 42, 43, 44 make it possible to transmit the complement of each binary signal to the gate of a transistor 71, 72, 73, 74. Each transistor 71, 72, 73, 74 is sized so as to have the same current-voltage characteristics as each transistor 31, 32, 33, 34, respectively. Thus, the transistors 31, 32, 33, 34 and 71, 72, 73, 74, when turned on operate in the unsaturated state wherein the characteristic curve is like a straight slope line representing an equivalent resistance. The transistors among the transistors 31, 32, 33, 34 which are turned on by the digital control signal contr' define a resistance value between the node 5 and the ground potential equal to the resistance value between the node 6 and the potential Vdd defined by the turn-on, by the complement of the control signal contr', of the equivalent transistors among the transistors 71, 72, 73, 74.

Figure 11:
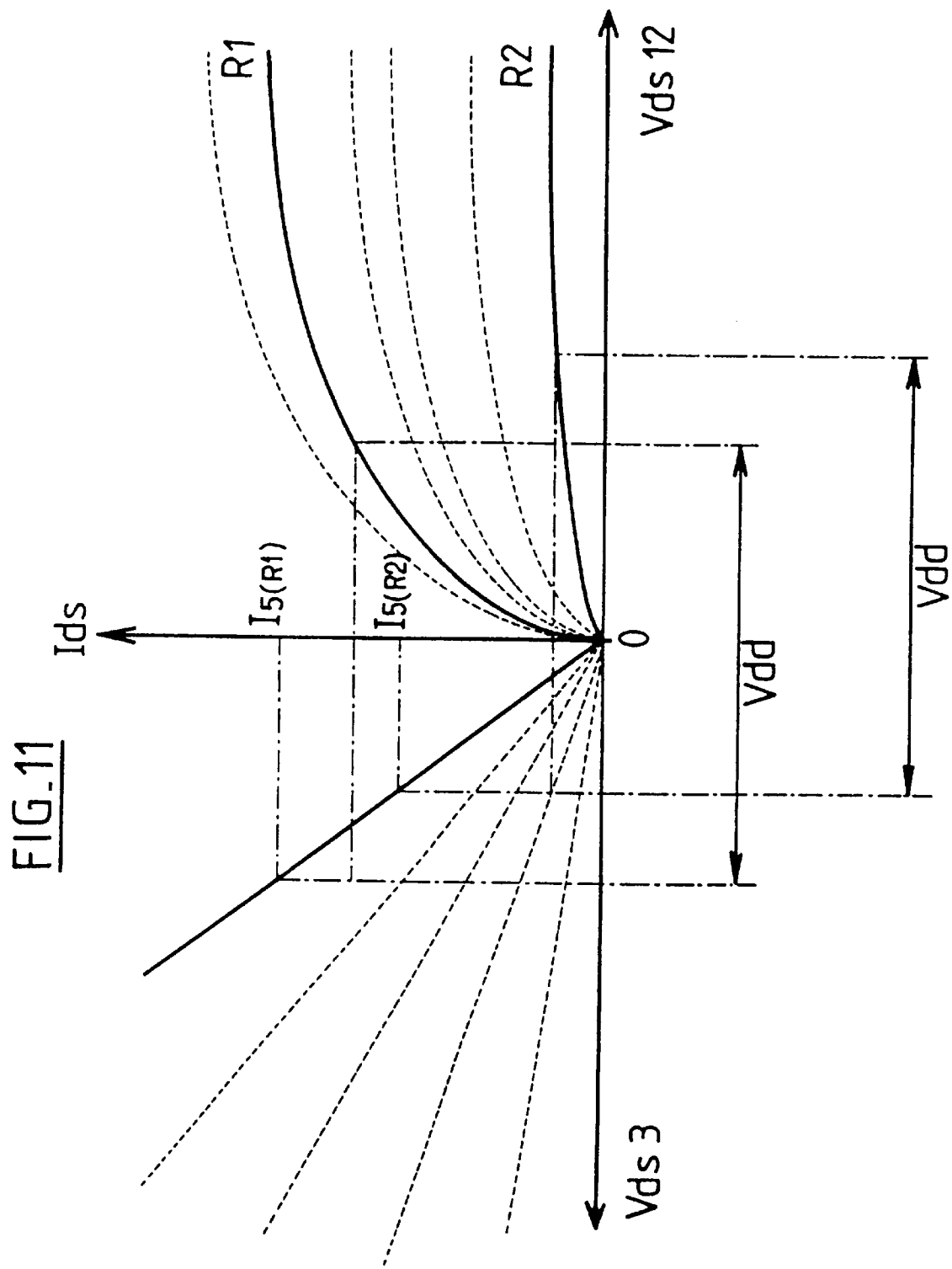
FIGS. 11 and 12 represent current-voltage characteristics of MOS transistors for various gate voltage values for the second example of a delay cell according to the invention.

FIG. 11 shows a case in which all the bits of the digital control signal contr' are at the potential Vdd. All the transistors 31, 32, 33, 34 are turned on, and the apparent resistance between the node 5 and the ground potential is minimal. This corresponds to a current-voltage characteristic Ids(Vds3) with a maximal slope.

A steep leading edge of the change of the input signal inp to the potential Vdd, which is higher than the potential of the node 5, causes a rapid turn-on of the transistor 2 in the unsaturated state and the turn-off of the transistor 1. In this case, the high value of the control signal contr' (all the bits at 1) causes all the transistors 31, 32, 33, 34 to remain at the linear characteristic curve in bold lines. Two operating states of the transistor 12 are shown in FIG. 11. FIG. 11 represents the superimposition of two operating instants, an instant in a first state R1 symbolized by the segment Vdd shifted to the left and an instant in a second state R2 symbolized by the segment Vdd shifted to the right.

In the first state R1, the turn-on of the transistor 2 has the effect of causing the flow of a current $I_2$ which is added to the current $I_{12}$ of the transistor 12 so as to obtain the current $I_{5(R1)}$. This has two effects. A first effect increases the voltage Vds3 of the node 5 in order to absorb the additional current $I_2$. The operating points have a tendency to shift to the left of the figure. The second effect reduces the voltage of the node 4 and changes the transistor 12 to characteristic curves such as the characteristic curve R1 shown in a bold line, by reducing its voltage Vgs. However, as seen in the figure, the current $I_2$ equal to $I_{5(R1)}-I_{12}$ remains weak and the node 4 discharges slowly, remaining at a potential level close to Vdd. The operating points of the transistor 12 remain on characteristic curves close to that of Vgsmax by slightly reducing the current $I_{12}$. The transistor 12 then causes an inverse feedback which acts in opposition to the lowering of the potential of the node 4. This has the result of keeping the output signal ext close to the high value.

In the second state R2, the change of the transistor 12 to lower characteristic curves of Vgs is accelerated. It is evident from the characteristic curve R2 shown in a bold line, which indicates the current $I_{12}$, that the difference $I_{5(R2)}-I_{12}$. is increasing. The tendency to shift the operating points to the left is reversed. The placement into saturation of the transistor 12 causes an avalanche effect which abruptly shifts the operating points to the right, rapidly changing the voltage Vdd to the voltage Vds12 until the transistor 12 turns off. This has the effect of bringing the output signal ext to its low value following a steep leading edge.

The operating states presented in FIG. 11 are those which produce the shortest delays, since the current $I_5$ is the strongest that can be obtained, owing to the high value of contr' (all the bits at 1). The hysteresis caused by the inverse feedback of the transistor 12 is of low magnitude.

Figure 12:
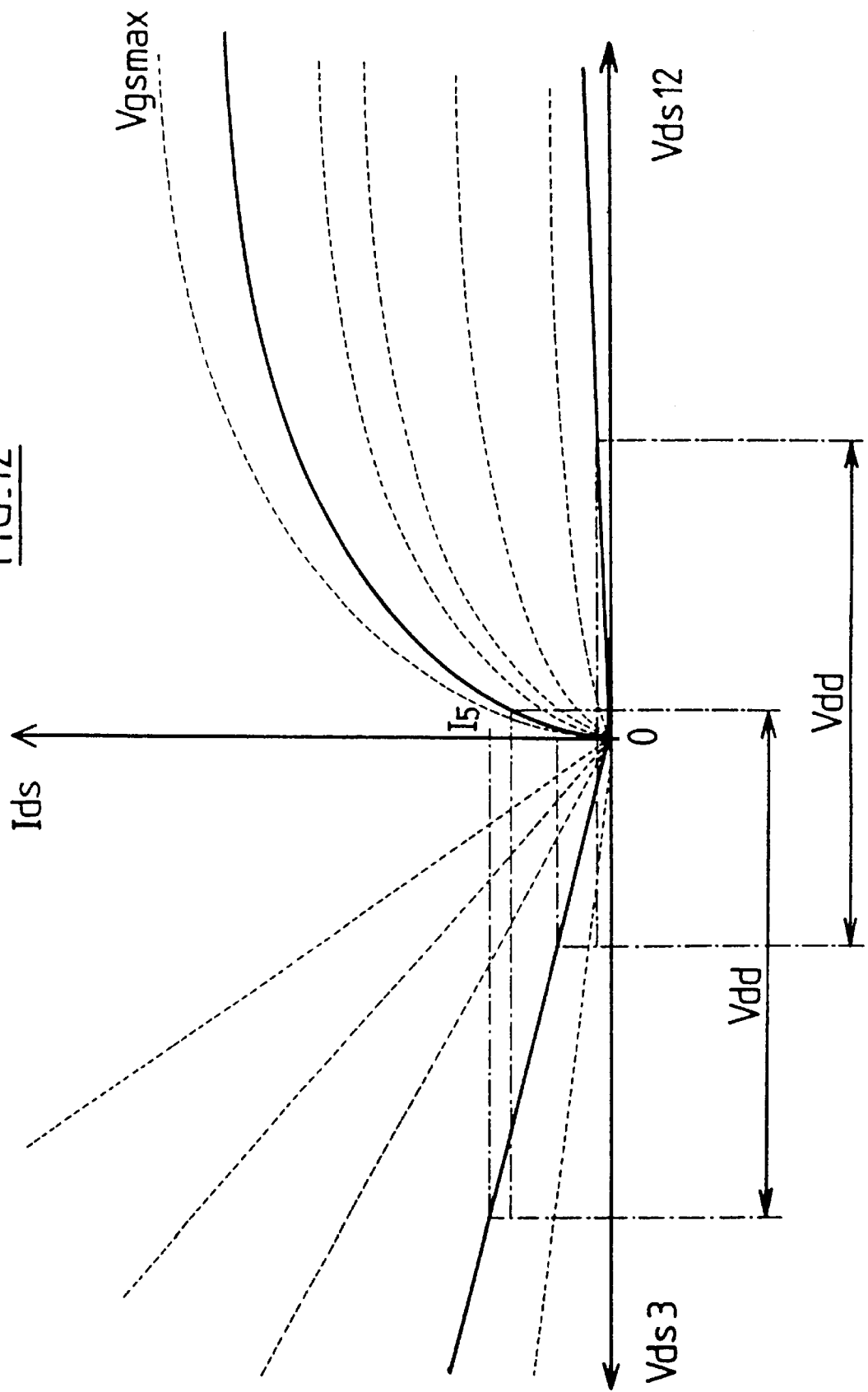

FIG. 12 shows a case in which only one bit of the digital control signal contr' is at the potential Vdd. Only one of the transistors 31, 32, 33, 34 is turned on, and the apparent resistance between the node 5 and the ground potential is maximal. This corresponds to a current-voltage characteristic Ids(Vds3) with a minimal slope.

A steep slope of the change of the input signal inp to the potential Vdd, which is higher than the potential of the node 5, causes a rapid turn-on of the transistor 2 in the unsaturated state and the turn-off of the transistor 1. Here, the low value of the digital control signal contr' causes all of the transistors 31, 32, 33, 34 to remain on the linear characteristic curve Ids(Vds3) shown in a bold line having a low guide coefficient. Two operating states of the transistor 12 can be seen in FIG. 12. FIG. 12 represents the superimposition of two operating instants, an instant in a first state R1 symbolized by the segment Vdd shifted to the left, and an instant in a second state R2 symbolized by the segment Vdd shifted to the right.

In the first state R1, the turn-on of the transistor 2 has the effect of causing the flow of a current $I_2$ which is added to the current $I_{12}$ of the transistor 12 so as to obtain the current $I_5$. This has two effects. A first effect increases the voltage Vds3 between the ground potential and the node 5, in order to absorb the additional current $I_2$. The operating points have a tendency to shift to the left of the figure. The second effect reduces the voltage of the node 4 and changes the transistor 12 to the characteristic curve of the state R1 by reducing its voltage Vgs. However, as seen in the figure, the current $I_2$ equal to $I_5-I_{12}$ remains weak and the node 4 discharges slowly, remaining at a potential level close to Vdd. The operating points of the transistor 12 remain on characteristic curves close to that of Vgsmax by slightly reducing the current $I_{12}$. The transistor 12 therefore causes an inverse feedback which acts in opposition to the lowering of the potential of the node 4. This has the result of keeping the output signal ext close to the high value. The output signal ext is kept at its high value longer than in the example in FIG. 11 because the current in the transistor 2 is very weak due to the high voltage of the node 5.

In the second state R2, the change of the transistor 12 to lower characteristic curves of Vgs accelerates more easily the closer the latter are to the vicinity of the point 0 and the more preponderant the current $I_2$ of the transistor 2 becomes relative to the current $I_{12}$ of the transistor 12. The tendency to shift the operating points to the left is reversed. The placement into saturation of the transistor 12 causes an avalanche effect which abruptly shifts the operating points to the right, rapidly changing the voltage Vdd to the voltage Vds12 until the transistor 12 turns off. It is evident in FIG. 12 that nearly all of the current of the node 5 is absorbed by the transistor 2. This has the effect of bringing the output signal ext to its low value following a steep leading edge.

The operating states presented in FIG. 12 are those which produce long delays because the weak currents $I_3$ cause weak currents $I_2$ which cause a large hysteresis on the change of state of the output signal ext. At the end of hysteresis, the change of state occurs with a steep leading edge having a slope comparable to that which can be observed in the example explained in FIG. 11.

For the sake of symmetry, the behavior of the transistors 1, 71, 72, 73, 74 and 11 for the change of the output signal ext from the low state to the high state is identical to the behavior of the transistors 2, 31, 32, 33, 34 and 12 for the change of the output signal ext from the high state to the low state. The explanations above remain valid when dealing with the characteristic curves for PMOS transistors, by replacing the node 5 with the node 6 and the voltages Vds3, Vds12 with Vds7, Vds11 respectively.

In the preceding, FIGS. 11 and 12 do not attempt to determine the operating points with the precision afforded by the complete equations of the transistors. Their schematic form makes it possible to explain the significance of the transistor 12 or the transistor 11 in a simple way.

Figure 5:
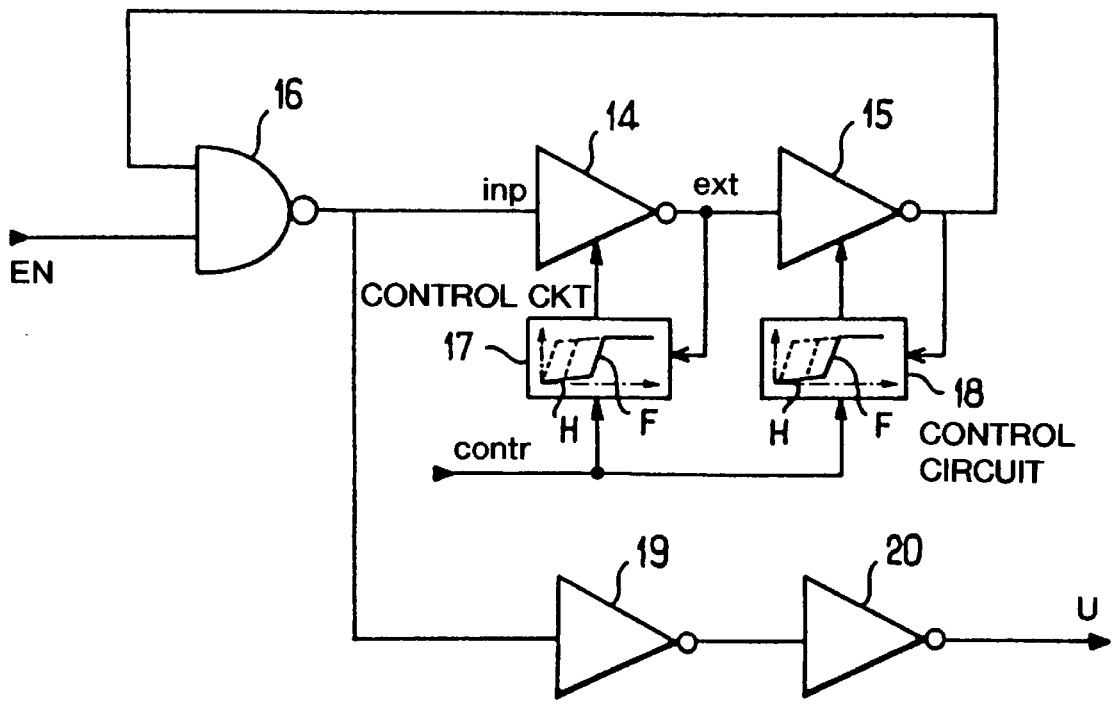
FIG. 5 represents an oscillator according to the invention.

FIG. 5 shows an example of a variable frequency oscillator according to the invention. An oscillator of this type is essentially constituted by an odd number of inverters connected in series, the output of the last inverter being looped to the input of the first. The first inverter is embodied by a NAND gate 16. A second and a third inverter are embodied by cells 14 and 15 with a variable delay τ. The output of the cell 15 is looped to a first input of the gate 16. A signal EN is introduced into a second input of the gate 16 in order to start the oscillator. When the signal EN is at 0, the output of the gate 16 is at 1; the output of the cell 14 is then at 0, the output of the gate 15 is at 1 and the output of the gate 16 remains at 1. The state of the loop 16, 14, 15 is stable and the system does not oscillate. When the signal EN rises to 1, the output of the gate 16 lowers to 0, the output of the cell 14 rises to 1 with the delay τ and the output of the cell 15 lowers to 0 with the delay τ. If the output of the gate 16 changes its state with a delay τ' at the change of state of one of its inputs, the output of the gate 16 then rises to 1 with a delay τ'. As long as the signal EN is at 1, the first input of the gate 16 reaches the value of its output with a delay 2τ. This has the effect of inverting the output of the gate 16 with a delay 2τ+τ'. The inversion of the output signal of the gate 16 with a period T=2τ+τ' causes the oscillation of the loop at a frequency equal to ½T. The output of the gate 16 is also connected to the input of an inverter 19, the output of which is connected to an inverter 20. The output of the inverter 20 makes it possible to obtain a utilization signal U which is an image of the output of the gate 16.

The delay of a cell 14, 15 is controlled by a control signal contr which uses a control circuit 17, 18 to control the temporal profile of the extracted signal for a variation on a steep leading edge of the input signal. This profile breaks down into two parts. A first hysteresis part H tends to keep the extracted signal in its preceding state. A second leading edge part F rapidly brings the extracted signal to its new state. The delay of the output signal (ext) is of a magnitude that is a function of the control signal (contr), wherein after a change in a value of the input signal corresponding to a first logic state of the input signal (inp), the output signal (ext) tends to maintain a voltage value corresponding to its preceding value for a certain length of time after which the value of the output voltage signal physically changes to a second value corresponding to the second logic state.

In the case of FIG. 3 or 4, the control circuits 17, 18 are constituted by transistors 3 and 12 if an improvement of FIG. 2a is satisfactory. If symmetrical behavior on the rise and on the descent is desired, the control circuits 17, 18 are constituted by the transistors 3, 7, 11, 12 to which are connected the transistors 9 and 10, which can be common to several cells. The control signal is then an analog signal contr.

In the case of FIG. 10, the means 17, 18 are constituted by transistors among the transistors 31, 32, 33, 34 and 12 if an improvement of FIG. 2a is satisfactory. If symmetrical behavior on the rise and on the descent is desired, the means 17, 18 are constituted by the transistors 31, 32, 33, 34, 71, 72, 73, 74, 11, 12 to which the inverters 41, 42, 43, 44 are connected. For a cascading of cells from FIG. 10 according to the model in FIG. 4, the inverters 41, 42, 43, 44 can be common to several cells. The control signal is then a digital control signal contr' which, in certain applications, can have the advantage of greater immunity to noise.

While the preferred forms and embodiments of the invention have been illustrated and described, it will be apparent to those of ordinary skill in the art that various changes and modifications may be made without deviating from the inventive concept and spirit of the invention as set forth above, and it is intended by the appended claims to define all such concepts which come within the full scope and true spirit of the invention.

What is claimed is:

1. A process for obtaining a variable frequency output signal (U) from an oscillator having an odd number of serially connected inverter cells (16, 14, 15) comprising:

applying an input signal (en) having a logic state to a first inverter cell (16) of said serially connected inverter cells (16, 14, 15), said first of said serially connected inverter cells having a first output with a logic state which is inverted relative to the logic state of said input signal (en);

receiving at each of said inverter cells (14, 15) successive to said first of said serially connected inverter cells (16, 14, 15) an input signal (inp, inp') having a logic state corresponding to a logic state of an output of a preceding one of said serially connected inverter cells (16, 14, 15) to provide an inverted output signal (ext, ext') at each of said serially connected inverter cells;

feeding back the inverted output signal (ext, ext') of each of said inverter cells (14, 15) successive to said first of said serially connected inverter cells (16, 14, 15) to a corresponding control circuit and applying to said corresponding control circuit, a control signal (contr, contr') to derive from each control circuit a temporal profile of the output signal (ext, ext') which is applied to the corresponding inverter cell for delaying the output signal (ext, ext'), said delayed output signal having a delay T which is of a magnitude that is a function of the control signal (contr, contr'), wherein after a change in a value of the input signal corresponding to a first logic state of the input signal (inp, inp') said output signal (ext, ext') tends to maintain a value corresponding to its preceding value for a certain length of time after which the value of said output voltage signal abruptly changes to a second value corresponding to the second logic state; and applying the inverted output of a last of said serially connected inverter cells (16, 14, 15) to an input of the first of said serially connected inverter cells (16, 14, 15); and whereby the variable frequency output signal (U) is obtained from the first inverter cell of said serially connected inverter cells (16, 14, 15).

2. The process for obtaining a variable frequency signal (U) according to claim 1, wherein the inverter cells include at least one amplifier having a gain and the process further includes the steps of controlling the gain of the amplifier by feeding back the output so as to act on the gain of the amplifier, thereby controlling the amplification of the input signal (inp).

3. A variable frequency oscillator operatively controlled by a control signal (contr, contr') comprising an odd number of cascaded inverting cells (14, 15, 16), a first inverting cell having an input connected to receive an input signal, each succeeding inverting cell of the cascaded inverting cells (14, 15, 16) having an input connected to receive an output signal (ext, ext') derived from a preceding inverting cell, the output signal (ext, ext') being connected to a control circuit (17, 18) having a control signal applied thereto for controlling a temporal profile of the output signal (ext, ext'), the input of the first inverting cell (16) being connected to receive an output of the last cell (15) of the cascaded inverting cells, at least one inverting cell (14, 15) being constituted by a cell having a gain that is variable as a function of the control signal (contr, contr') applied to said at least one inverting cell (14, 15) for causing the output signal (ext ext') from said at least one inverting cell (14, 15) to remain substantially in its current logic state for a certain length of time after which the output signal (ext, ext') from said at least one inverting cell abruptly (14, 15) changes to a logic state with a steep leading edge at the output of said at least one inverting cell (14, 15) for a change in logic state at the input of said at least one inverting cell (14, 15).

4. The variable frequency oscillator according to claim 3 wherein the variable gain cell comprises:
an inverting amplifier (1, 2) fed by a high-potential node (6) and a low-potential node (5), the output of which is constituted by an output node (4),
a first transistor (3) having a source, drain and gate, the source being connected to a fixed potential lower than the potential of the low-potential node (5), the drain being connected to the low-potential node (5) and the gate being at the potential of the control signal (contr) in analog form, and
a second transistor (12) having a source, drain and gate, the drain being connected to a fixed potential higher than the potential of the high-potential node (6), the source being connected to the low-potential node (5) and the gate being at the potential of the output node (4) such that the second transistor (12) conducts a current when the output node (4) is at a potential higher than the low-potential node (5).

5. The variable frequency oscillator according to claim 3 wherein the variable gain cell comprises:
an inverting amplifier (1, 2) fed by a high-potential node (6) and a low-potential node (5), the output of which is constituted by an output node (4),
a first transistor (7) having a source, drain and gate, the source being connected to a fixed potential higher than the potential of the high-potential node (6) and the drain being connected to the high-potential node (6) and the gate being at the potential of the control signal (contr) in analog form, and
a second transistor (11) having a source, drain and gate, the drain connected to a fixed potential lower than the potential of the low-potential node (5), the source being connected to the high-potential node (6) and the gate being at the potential of the output node (4) such that the second transistor (11) conducts a current when the output node (4) is at a potential lower than the high-potential node (6).

6. The variable frequency oscillator according to claim 4 wherein the variable gain cell further comprises:
a third transistor (7) having a source, drain and gate, the source being connected to a fixed potential higher than the potential of the high-potential node (6) and the drain being connected to the high-potential node (6) and the gate being at the potential of the control signal (contr) in analog form, and a fourth transistor (11) having a source, drain and gate, the drain connected to a fixed potential lower than the potential of the low-potential node (5), the source being connected to the high-potential node (6) and the gate being at the potential of the output node (4) such that the fourth transistor (11) conducts a current when the output node (4) is at a potential lower than the high-potential node (6).

7. The variable frequency oscillator according to claim 3 wherein the variable gain cell comprises:
an inverting amplifier (1, 2) connected to be fed by a high-potential node (6) and a low-potential node (5), the output of which is constituted by an output node (4),
a first plurality of transistors (31, 32, 33, 34) each having a source, drain and gate, the sources being connected to a fixed potential lower than the potential of the low-potential node (5), the drains being connected to the low-potential node (5) and each of whose rates is at a high or low potential of a bit of the control signal (contr) in digital form, and
a second transistor (12) having a source, drain and gate, the drain being connected to a fixed potential higher than the potential of the high-potential node (6), the source being connected to the low-potential node (5) and the gate being at the potential of the output node (4).

8. The variable frequency oscillator according to claim 3 wherein the variable gain cell comprises:
an inverting amplifier (1, 2) connected to be fed by a high-potential node (6) and a low-potential node (5), the output of which is constituted by an output node (4),
a first plurality of transistors (71, 72, 73, 74) each having a source, drain and gate, the sources being connected to a fixed potential higher than the potential of the high-potential node (6), the drains being connected to the high-potential node (6) and each of whose gates is adapted to be connected to receive an inverted low- or high-potential of a bit of the control signal (contr) in digital form, and
a second transistor (11) having a source, drain and gate, the drain being connected to a fixed potential lower than the potential of the low-potential node (5), the source being connected to the high-potential node (6) and the gate being at the potential of the output node (4).

9. The variable frequency oscillator according to claim 7, wherein the variable gain cell further comprises:
a third plurality of transistors (71, 72, 73, 74) each having a source, drain and gate, the sources being connected to a fixed potential higher than the potential of the high-potential node (6), the drains being connected to the high-potential node (6) and each of whose gates is adapted to be connected to receive an inverted low- or high-potential of a bit of the control signal (contr) in digital form, and
a fourth transistor (11) having a source, drain and gate, the drain being connected to a fixed potential lower than the potential of the low-potential node (5), the source being connected to the high-potential node (6) and the gate being at the potential of the output node (4).

10. A cell for obtaining an output signal (ext) with a variable delay $\tau$ in response to an input signal (inp), the output signal (ext, ext') being connected to a control circuit having a control signal applied thereto for controlling a temporal profile of the output signal (ext), comprising:
an inverting amplifier having a gain controlled by a control signal (contr, contr'), wherein the output signal (ext) is inversely related to the value of the gain so as to cause the output signal (ext, ext') to remain substantially in its current logic state for a certain length of time after which the output signal (ext,ext') changes its logic state with a magnitude that is a function of the control signal (contr, contr') after a change of state of the input signal (inp).

11. The cell according to claim 10, further comprising:

the inverting amplifier (1, 2) being connected to be fed by a high-potential node (6) and a low-potential node (5), and having an output node (4) for supplying an output signal (ext), a first transistor (3) having a source, drain and gate, the source connected to a fixed potential lower than the potential of the low-potential node (5) the drain being connected to the low-potential node (5), and the gate adapted to be maintained at the potential of the control signal (contr) in analog form, and a second transistor (12) having a drain, source and gate, the drain being connected to a fixed potential higher than the potential of the high-potential node (6), the source being connected to the low-potential node (5) and the gate being at the potential of the output node (4) such that the second transistor (12) conducts a current when the output node (4) is at a potential higher than the low-potential node (5).

12. The cell according to claim 10 further comprising:

the inverting amplifier (1, 2) being connected to be fed by a high-potential node (6) and a low-potential node (5), and having an output node (4) for supplying an output signal (ext), a first transistor (7) having a source, drain and gate, the source being connected to a fixed potential greater than the potential of the high-potential node (6), the drain being connected to the high-potential node (6) and the gate being at the potential of the control signal (contr) in analog form, and a second transistor (11) having a source, drain and gate, the drain being connected to a fixed potential lower than the potential of the low-potential node (5), the source being connected to the high-potential node (6) and the gate being at the potential of the output node (4) such that the second transistor (11) conducts a current when the output node (4) is at a potential lower than the high-potential node (6).

13. The cell according to claim 11 further comprising:

a third transistor (7) having a source, drain and gate, the source being connected to a fixed potential greater than the potential of the high-potential node (6) and the drain being connected to the high-potential node (6) and the gate being at the potential of the control signal (contr) in analog form, and a fourth transistor (11) having a source, drain and gate, the drain connected to a fixed potential lower than the potential of the low-potential node (5), the source being connected to the high-potential node (6) and the gate being at the potential of the output node (4) such that the fourth transistor (11) conducts a current when the output node (4) is at a potential lower than the high-potential node (6).

14. The cell according to claim 10 further comprising:

the inverting amplifier (1, 2) being fed by a high-potential node (6) and a low-potential node (5), and having an output node (4) for supplying an output signal (ext), a first plurality of transistors (31, 32, 33, 34) each having a source, drain and gate, the sources being connected to a fixed potential lower than the potential of the low-potential node (5), the drains being connected to the low-potential node (5) and each gate being at a high- or low-potential of a bit of the control signal (contr) in digital form, and a second transistor (12) having a source, drain and gate, the drain being connected to a fixed potential higher than the potential of the high-potential node (6), the source being connected to the low-potential node (5) and the gate being at the potential of the output node (4).

15. A cell according to claim 10, further comprising:

the inverting amplifier (1, 2) being fed by a high-potential node (6) and a low-potential node (5), and having an output node (4) for supplying an output signal (ext), a first plurality of transistors (71, 72, 73, 74) each having a source, drain and gate, the sources being connected to a fixed potential higher than the potential of the high-potential node (6), the drains being connected to the high-potential node (6), and each of the gates is adapted to receive an inverted low- or high-potential of a bit of the control signal (contr) in digital form, and a second transistor (11) having a source, drain and gate, the drain being connected to a fixed potential lower than the potential of the low-potential node (5), the source being connected to the high-potential node (6) and the being at the potential of the output node (4).

16. A cell according to claim 14, further comprising:

a third plurality of transistors (71, 72, 73, 74) each having a source, drain and gate, the sources being connected to a fixed potential higher than the potential of the high-potential node (6), the drains being connected to the high-potential node (6), and each of the gates is adapted to receive an inverted low- or high-potential of a bit of the control signal (contr) in digital form, and a fourth transistor (11) having a source, drain and gate, the drain being connected to a fixed potential lower than the potential of the low-potential node (5), the source being connected to the high-potential node (6) and the gate being at the potential of the output node (4).

* * * * *